(12) United States Patent
Reitinger (10) Patent No.: US 9,599,662 B2
(45) Date of Patent: Mar. 21, 2017

(54) APPARATUS FOR CONDITIONING SEMICONDUCTOR CHIPS AND TEST METHOD USING THE APPARATUS

(75) Inventor: Klemens Reitinger, Starnberg (DE)

(73) Assignee: ERS Electronic GmbH, Germering (DE)

( * ) Notice: Subject to any disclaimer, the term of this patent is extended or adjusted under 35 U.S.C. 154(b) by 544 days.

(21) Appl. No.: 13/499,866

(22) PCT Filed: Sep. 22, 2010

(86) PCT No.: PCT/EP2010/063975
§ 371 (c)(1),
(2), (4) Date: Jun. 26, 2012

(87) PCT Pub. No.: WO2011/039087
PCT Pub. Date: Apr. 7, 2011

(65) Prior Publication Data
US 2012/0311858 A1    Dec. 13, 2012

(30) Foreign Application Priority Data

Oct. 2, 2009  (DE) .................. 10 2009 045 291

(51) Int. Cl.
*G01R 31/26*  (2014.01)
*G01R 31/28*  (2006.01)

(52) U.S. Cl.
CPC ..... *G01R 31/2874* (2013.01); *Y10T 29/49139* (2015.01); *Y10T 29/5313* (2015.01)

(58) Field of Classification Search
CPC ........... H05K 13/0413; H05K 13/0408; G01R 31/2874

(Continued)

(56) References Cited

U.S. PATENT DOCUMENTS

| 5,172,049 A | 12/1992 | Kiyokawa et al. |
| 5,192,908 A * | 3/1993 | Shibata ............ G01R 1/04 324/750.19 |

(Continued)

FOREIGN PATENT DOCUMENTS

| CN | 1647246 A | 7/2005 |
| CN | 1858607 A | 11/2006 |

(Continued)

OTHER PUBLICATIONS

Feb. 25, 2014 Office Action of corresponding application Chinese patent application No. 2010800447443, 10 pgs.

*Primary Examiner* — Peter DungBa Vo
*Assistant Examiner* — Kaying Kue
(74) *Attorney, Agent, or Firm* — Norton Rose Fulbright US LLP (57) ABSTRACT

The present invention provides a device for conditioning semiconductor chips and a corresponding test method. The device comprises a chip temperature control means for receiving a semiconductor chip or a plurality of semiconductor chips and comprises a base body which can be flushed with a fluid for temperature control and which comprises a corresponding number of recesses which extend from a front face to a rear face of the base body; a corresponding number of chip bonding pedestals which are inserted, in thermal contact with the base body, into the recesses which comprise a chip receiving region on the front face and a wiring means on the inside which is constructed for supplying electrical signals from and/or to the semiconductor chip inserted in the respective chip receiving region; and a motherboard attached to the rear face in such a way that the wiring means of the chip bonding pedestals is electrically connected to a wiring means of the motherboard.

5 Claims, 5 Drawing Sheets (58) Field of Classification Search
USPC ......... 29/743, 740, 741, 757, 759, 762, 705, 29/739, 832, 854
See application file for complete search history.

(56) References Cited

U.S. PATENT DOCUMENTS

| | | | | |
|---|---|---|---|---|
| 5,568,054 | A * | 10/1996 | Iino | G01R 31/2868 324/537 |
| 5,631,573 | A * | 5/1997 | Ohno | G01R 1/0433 324/754.07 |
| 5,847,293 | A * | 12/1998 | Jones | G01R 31/2851 324/750.08 |
| 5,885,353 | A | 3/1999 | Strodtbeck et al. | |
| 5,907,246 | A | 5/1999 | Abraham et al. | |
| 5,911,897 | A * | 6/1999 | Hamilton | G01R 31/2874 219/209 |
| 6,049,217 | A * | 4/2000 | Viswanath | G01R 1/0458 324/750.1 |
| 6,104,204 | A * | 8/2000 | Hayama | G01R 1/0458 324/750.08 |
| 6,304,093 | B1 * | 10/2001 | Hilmoe | G01R 31/2863 324/750.13 |
| 6,549,026 | B1 * | 4/2003 | DiBattista | G01R 31/2891 324/224 |
| 6,889,841 | B2 * | 5/2005 | Maccoux | H05K 13/0084 206/722 |
| 7,002,363 | B2 * | 2/2006 | Mathieu | G01R 1/07342 324/324 |
| 7,225,819 | B2 * | 6/2007 | Jackson | B08B 3/02 134/137 |
| 7,812,627 | B2 * | 10/2010 | Yamamoto | G01R 31/2875 324/750.05 |
| 7,888,957 | B2 * | 2/2011 | Smith | G01R 1/06772 324/754.07 |
| 7,900,373 | B2 * | 3/2011 | Reitinger | H01L 21/67109 118/712 |
| 2002/0011863 | A1 * | 1/2002 | Takahashi | G01R 31/2863 324/750.03 |
| 2005/0225346 | A1 | 10/2005 | Saito et al. | |
| 2005/0275398 | A1 * | 12/2005 | Yamashita | G01R 31/2851 324/750.03 |
| 2006/0244472 | A1 | 11/2006 | Hayashi et al. | |
| 2007/0024299 | A1 * | 2/2007 | Itakura | H01L 21/67109 324/750.08 |

FOREIGN PATENT DOCUMENTS

| | | |
|---|---|---|
| DE | 10 2006 036291 A1 | 2/2008 |
| EP | 1 495 486 B1 | 1/2005 |
| JP | H03195038 | 8/1991 |
| JP | H03195039 | 8/1991 |
| JP | H05249179 | 9/1993 |
| JP | 2005326384 | 11/2005 |
| JP | 2006337359 | 12/2006 |
| WO | WO 99/18447 A1 | 4/1999 |
| WO | WO 99/38209 A2 | 7/1999 |
| WO | WO 2009/046884 A2 | 4/2009 |

* cited by examiner

APPARATUS FOR CONDITIONING SEMICONDUCTOR CHIPS AND TEST METHOD USING THE APPARATUS

CROSS-REFERENCE TO RELATED APPLICATION(S)

This application is a Section 371 National Stage Application of International No. PCT/EP2010/063975, filed 22 Sep. 2010 and published as WO 2011/039087 A1 on 7 Apr. 2011, which claims priority from the DE Patent Application No. 10 2009 045 291.5, filed 2 Oct. 2009, the contents of which are incorporated herein in their entirety for all purposes.

FIELD OF THE INVENTION

The present invention relates to a device for conditioning semiconductor chips and a test method using said device.

BACKGROUND INFORMATION

Test measurements are known to be carried out on semiconductor chips typically within a temperature range of between −200° C. and +400° C. For temperature control, a semiconductor chip is placed on a bonding pedestal, via which it is connected to an electronic test device, and said bonding pedestal is cooled and/or heated according to the desired temperature and tested in a climatic test chamber together with the semiconductor chip. In this case, it must be ensured that the temperature of the semiconductor chip does not fall below the dew point of the surrounding gaseous medium, since otherwise condensation of the moisture on the surface of the chip or ice forms, which impedes the test measurements or makes them impossible.

A method for conditioning semiconductor wafers is known from EP 1 495 486 B1 which comprises the following steps: preparing a space which is enclosed at least in part and has a chuck which is located therein for receiving a semiconductor wafer and feeding a dried fluid through the chuck for controlling the temperature of the wafer, at least a portion of the fluid exiting the chuck being used for conditioning the atmosphere inside the space.

In known devices for conditioning semiconductor chips, it has been found to be disadvantageous that loading and unloading the climatic test chamber is time-consuming, condensation problems occur and it is not possible to test a plurality of chips with a high throughput.

SUMMARY

An object of the present invention is thus to provide a device for conditioning semiconductor chips and a test method using said device which make efficient conditioning and a high throughput possible.

The devices and methods disclosed in the embodiments below provide for high throughput testing of semiconductor chips. Reliability of the devices and methods may be improved by controlling temperatures to reduce condensation.

The idea on which the present invention is based is that a chip temperature control device is provided for receiving a semiconductor chip or a plurality of semiconductor chips and comprises a base body which can be flushed with a fluid for temperature control and which comprises a corresponding number of recesses which extend from a front face to a rear face of the base body.

A chip bonding pedestal is respectively inserted into the recess or recesses of the base body, is in thermal contact with the base body and has a chip receiving region on the front face and a wiring means on the inside, which is constructed for supplying electrical signals from and/or to the semiconductor chip inserted in the chip receiving region. A motherboard is attached to the rear face of the base body in such a way that the wiring means of the chip bonding pedestal is electrically connected to a wiring means of the motherboard.

Therefore, a good thermal connection of the semiconductor chips and also high flexibility is ensured, since the chip bonding pedestal(s) can be easily changed and can be adapted to any chip geometries or chip bonding arrangements.

Advantageous developments and improvements of the related subject-matter of the invention are provided in the dependent claims.

BRIEF DESCRIPTION OF THE DRAWINGS

Embodiments of the invention are described in greater detail in the following description and are shown in the drawings, in which.

DETAILED DESCRIPTION OF EXAMPLE EMBODIMENTS

In the figures, like reference numerals denote like or functionally like components.

Figure 1:
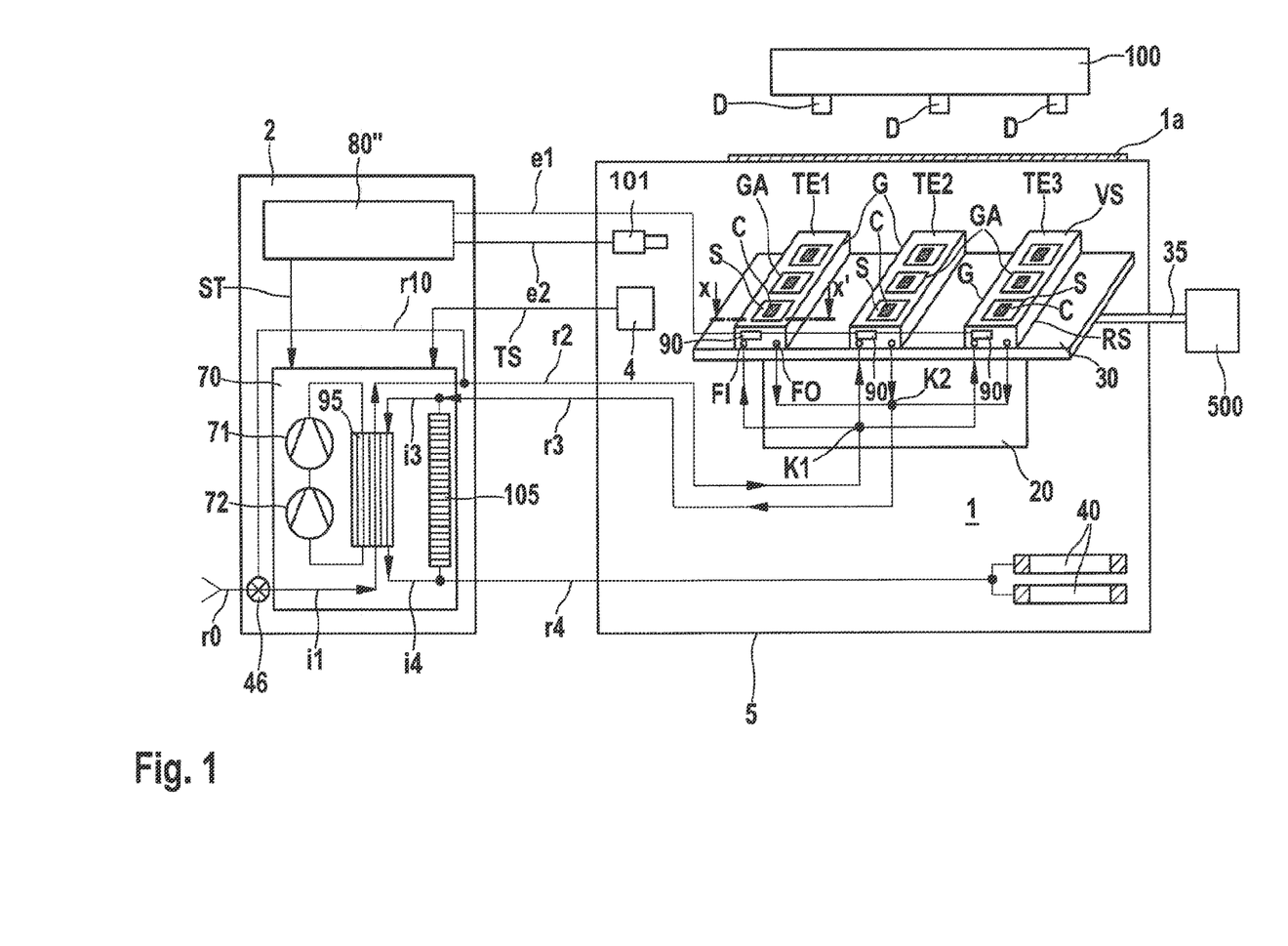
FIG. 1 is a schematic view of a first embodiment of the conditioning device according to the invention.

FIG. 1 is a schematic cross-section of a first embodiment of the conditioning device according to the invention.

In FIG. 1, reference numeral 1 denotes a space in a container 5, in which a temperature control means TE1, TE2, TE3 is provided for receiving a plurality of semiconductor chips C.

The chip temperature control means TE1, TE2, TE3 consists, in the example shown, of three identical modules TE1, TE2, TE3 which each comprise a base body G, for example made of high-grade steel, which can be flushed with a fluid for temperature control, for example dried air. The base bodies G each comprise a plurality of recesses GA which extend from a front face VS to a rear face RS of the base body G.

A plurality of chip bonding pedestals S, for example likewise made of high-grade steel, are respectively inserted into the recesses GA in thermal contact with the base body G. The chip bonding pedestals S have a chip receiving region SM on the front face VS and an insulated wiring means D1, D2 on the inside, which is constructed for supplying electrical signals from and/or to the semiconductor chip C inserted in the chip receiving region SM (cf. FIG. 2A, 2B).

Figure 2A:
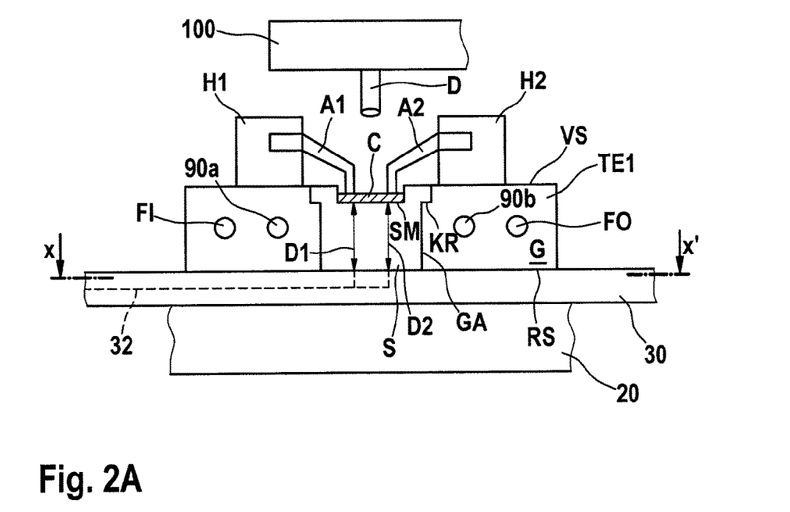
FIG. 2A is a schematic cross-section of the first temperature control means of the conditioning device according to the invention according to FIG. 1 along line X-X' with chips inserted.
Figure 2B:
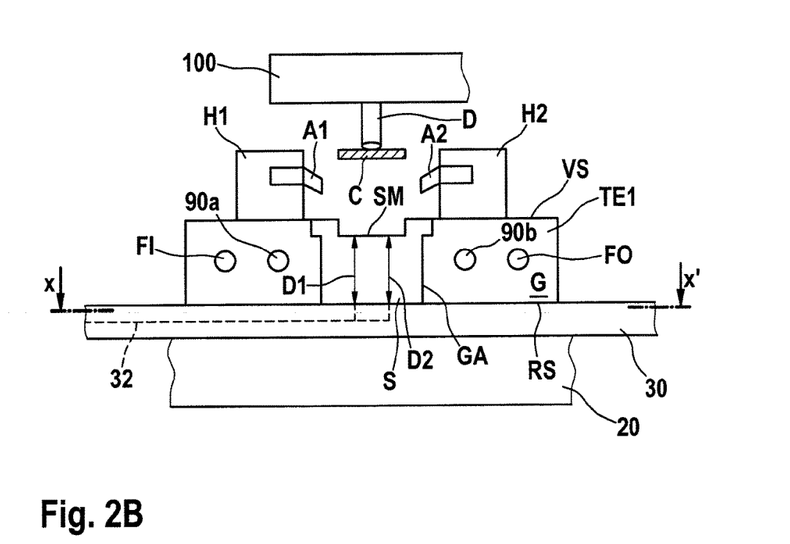
FIG. 2B is a schematic cross-section of the first temperature control means of the conditioning device according to the invention according to FIG. 1 along line X-X' with chips removed.

A motherboard 30 is attached to the rear face RS of the base body G in such a way that the wiring means D1, D2 of the chip bonding pedestal S is electrically connected to a wiring means 32 of the motherboard 30 (cf. FIG. 2A, 2B). A ribbon cable 35 is guided from the wiring means 32 of the motherboard 30 to outside the container 5 and is connected to a test device 500 which generates the test signals and evaluates the response signal of the semiconductor chip C.

The base body G and the motherboard 30 attached thereto are fastened to an optionally movable carrier table 20, which for example can be adjusted in the X, Y and Z directions.

The container 5, the volume of which is normally between 1 and 10 liters, is substantially closed and comprises a cover 1a, for example a slide cover, above the chip receiving region SM, which cover can automatically open for loading and unloading the semiconductor chips C.

A handling device 100, for example a robot having suction cups D, is provided for simultaneous loading and unloading of the semiconductor chips C. In other words, all of the semiconductor chips can be loaded or unloaded within a single working step of the robot 100.

The container 5 comprises ducts for electrical cables and media supply lines, and, if required, ducts for probes to be externally attached, using which the test measurements are carried out. Depending on the application, the space 1 does not however have to be hermetically sealed by the container 5, but must at least be closed to the extent that undesired penetration of moist ambient air can be prevented by building up excess pressure.

Furthermore, a heating means 90 is integrated into each base body G, can be supplied with electric current for heating via a cable e1 from outside and comprises a temperature probe (not shown).

A dew point sensor is denoted by reference number 101, by means of which the dew point within the container 5 can be detected and which can convey a corresponding signal to outside the container 5 via a cable e2. In particular, the dew point sensor 101 ensures safety when opening the appliance, and thus for example counter-heating can take place in order to prevent condensation.

Discharge members 40 are further provided in the container (WLOG only two are shown), via which discharge members dried air or a similar fluid, such as nitrogen, can be introduced into the container from outside via a line r4 in order to drive moist ambient air out of the container 5.

A separate unit, which is connected to the container 5 via the electrical cables e1, e2 and the media supply lines r2, r3, r4, is the temperature control rack 2, which is constructed as follows.

A temperature controller is denoted by reference numeral 80" and can control the temperature of the base body G of the modules of the chip temperature control means TE1, TE2, TE3 by heating the heating means 90, the base bodies G being simultaneously or alternatively flushed with the fluid in the form of dried air for cooling, as is described in greater detail below.

The temperature controller 80" not only serves to heat the heating means 90, but is also coupled to the dew point sensor 101 via the cable e2 and can thus initiate automatic counter-heating if there is a risk of condensation or ice formation. It also controls the temperature control means 70 via the control cable ST and thus takes on the role of a central temperature control system.

A temperature control means is denoted by reference numeral 70, to which dried air is guided via lines r0 and i1, for example from a gas cylinder or from an air drier and which comprises a heat exchanger 95, which is connected to cooling units 71, 72, by means of which it can be brought to a predetermined temperature.

The dried air guided via the lines r0, i1 is fed through the heat exchanger 95 and subsequently guided into the container 5 via the supply line r2 to the junction K1, in order to be fed from there in a parallel manner into the fluid inlets FI of the base body, which traverse corresponding cooling spirals or cooling pipes (not shown).

The dried air which has cooled the base body G exits in a parallel manner via fluid outlets FO of the base body G, via the junction K2 and subsequently via the line r3, and is fed out of the container 5.

A heating means 105 is additionally integrated into the temperature control means 70 and is not in direct contact with the heat exchanger 95. The line r3 is fed to the heating means 105, in such a way that the dried air of the heating means 105, exiting the sampler table 10 via the line r3, is guided back in the temperature control rack 2.

A portion of the dried air guided back via the line r3 is branched off before the heating means 105 via a line i3 and is fed through the heat exchanger 95, where it contributes to the cooling in the same way as the dried air freshly guided via the lines r0, i1. The dried air exits the heat exchanger 95 via the line i4 and is directly guided behind the heating means 105, together with the air which flowed through the heating means 105. This dried air is fed from the corresponding junction via the line r4 and the discharge members 40 into the container 5 for conditioning the atmosphere thereof.

A temperature sensor for recording the temperature in the space 1 is denoted by reference numeral 4 and conveys a corresponding temperature signal TS to the temperature control means 70, which is used for controlling the temperature by means of the heating means 105.

This embodiment further provides a controllable mixing valve 46 and a bypass line r10, using which the heat exchanger 95 can be bypassed.

Using this arrangement, the dried air can perform a double function, specifically initially cooling the base body G and subsequently conditioning the atmosphere of the space 1, before it is guided through openings of the container 5 back to the ambient atmosphere, and thus is used more effectively. A particular advantage is that a "residual coldness" of the dried air, which flows back from the base bodies G, can be used for cooling the heat exchanger 95 and can simultaneously be guided back, having been heated, into the container 5.

FIG. 2A is a schematic cross-section of the first temperature control means of the conditioning device according to the invention according to FIG. 1 along line X-X' with chips inserted, and FIG. 2B is a schematic cross-section of the first temperature control means of the conditioning device according to the invention according to FIG. 1 along line X-X' with chips removed.

As shown in FIG. 2A, the base body G has a rectangular cross-section, the clearances GA being provided approximately in the centre, and extending from the front face VS thereof to the rear face RS thereof. On the end face, the fluid inlet opening FI and the fluid outlet opening FO can be seen, which extend to or from the internal cooling line labyrinth. 90a denotes an inlet for the heating means 90; 90b denotes a corresponding outlet, the heating means 90 normally being provided in the form of an embedded resistor. The chip bonding pedestals S have an approximately square cross-section and are inserted into the clearances GA from above, a collar KR ensuring a good fit. An optimal thermal connection is ensured by a positive fit of the chip bonding pedestals S with the base body G. In particular, this thermal connection is strengthened in that both the base body G and the chip bonding pedestals S are produced from the same material, in this case high-grade steel. Additionally, a screw connection (not shown in this case) of the chip bonding pedestals S to the base body G can be provided, which is for example located in the region of the collar KR. The chip receiving region SM is located in the centre of the chip bonding pedestals S and is lowered relative to the front face VS of the base body G. On the side of the semiconductor chip C to be contacted, which faces the chip bonding pedestal S, contact surfaces (not shown) are located which are connected to the wiring means D1, D2 provided inside the chip bonding pedestal S.

The wiring means D1, D2 end on the upper surface of the chip bonding pedestal S, preferably with small projecting pins which come directly into contact with the contact surfaces of the semiconductor chip C and thus ensure a good electrical connection in the form of probe needles.

Respective chip holding means H1, H2 (not shown in FIG. 1 for clarity) are provided on the front face VS of the base body G adjacent to the chip bonding pedestals S and can be pneumatically actuated to hold a respective semiconductor chip C in the associated chip receiving region SM by urging said chip downwards. For this purpose, the chip holding means H1, H2 comprise holding arms A1, A2 which can be pneumatically actuated and which are shown in FIG. 2A with a semiconductor chip C inserted and in FIG. 2B with a semiconductor chip C removed. In particular, according to FIG. 2B, the holding arms A1, A2 with the semiconductor chip C removed, which according to FIG. 2B is located on the suction cup D of the handling device 100, are not only lifted vertically, but also rotated laterally, so as to enable uninterrupted removal and placement of the semiconductor chips C.

The connection of the wiring device D1, D2 to a wiring device 32 can likewise be seen clearly in FIGS. 2A, 2B, which wiring device 32 is provided on the motherboard 30 and which according to FIG. 1 is connected to the ribbon cable 35.

Figure 3:
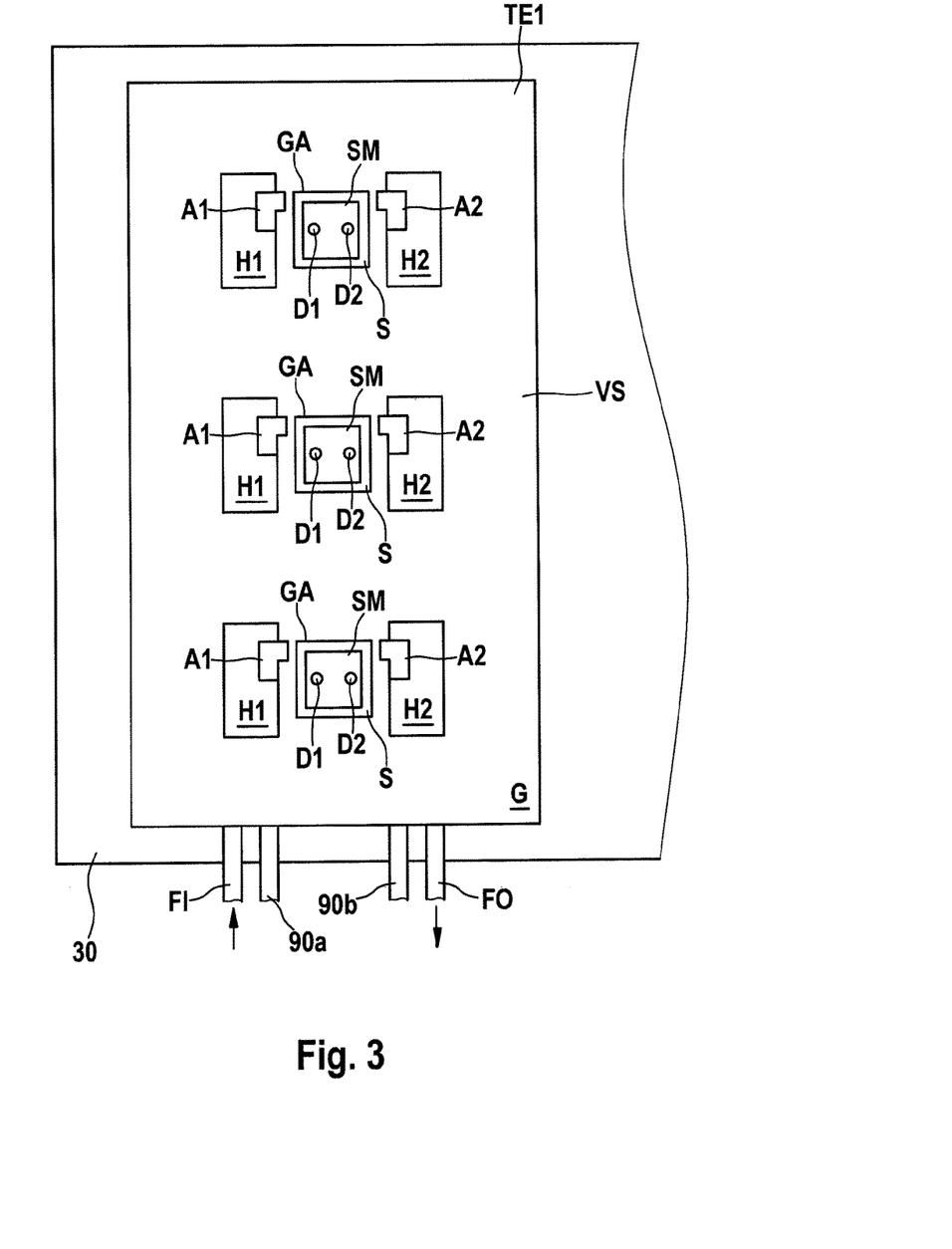
FIG. 3 is a plan view of the first temperature control means of the conditioning device according to the invention according to FIG. 1 with chips removed.

FIG. 3 is a plan view of the first temperature control means of the conditioning device according to the invention according to FIG. 1 with chips removed.

As can be seen from FIG. 3, the base body G is also rectangular in the plan view. The needle-probe-type upper ends of the wiring means D1, D2 can likewise be seen in FIG. 3.

Figure 4:
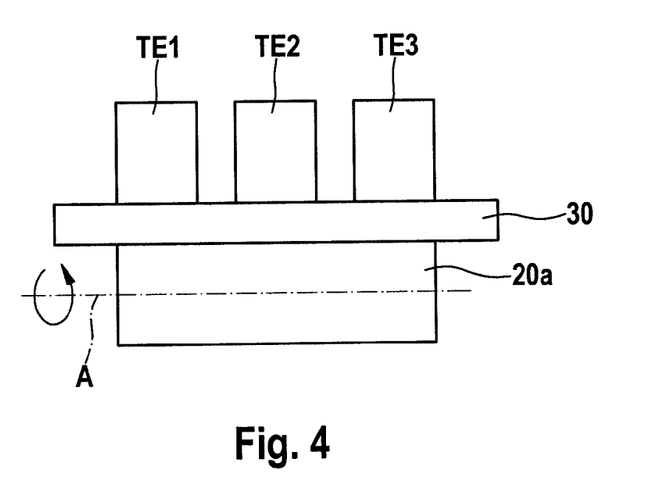
FIG. 4 is a schematic front view of the temperature control means, the motherboard and the carrier table for representing a second embodiment of the conditioning device according to the invention.

FIG. 4 is a schematic front view of the temperature control means, the motherboard and the carrier table for representing a second embodiment of the conditioning device according to the invention.

In the second embodiment shown in FIG. 4, the carrier table 20a, on which the motherboard 30 having the temperature control means TE1, TE2, TE3 is provided, can be rotated about an axis A, such that test measurements are possible at various angular positions of the semiconductor chips C. An angle-dependent measurement of this type of semiconductor chips C is necessary in particular for accelerometers in MEMS technology in order to be able to calibrate the chip signals.

Figure 5:
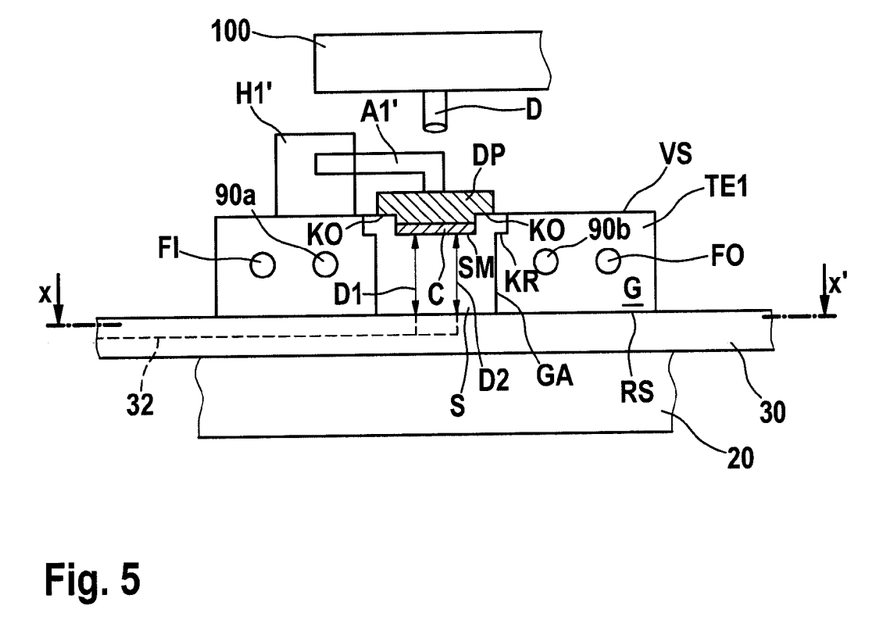
FIG. 5 is a schematic cross-section of the first temperature control means according to a further embodiment of the conditioning device according to the invention.

FIG. 5 is a schematic cross-section of the first temperature control means according to a further embodiment of the conditioning device according to the invention.

FIG. 5 is analogous to FIG. 2A, reference numeral H1' denoting a modified chip holding means. The chip holding means H1' comprises a holding arm A1', on the end of which a cover plate DP made of high-grade steel is provided. The cover plate DP can be applied to the semiconductor chip C inserted in the chip receiving region SM in such a way that it is in thermal contact with the semiconductor chip C on one side and in thermal contact with the bonding pedestal S on the other side, the contact regions between the cover plate DP and the chip bonding pedestal S being denoted by the reference numeral KO.

This embodiment has the advantage that an even better thermal connection of the chip is ensured. In this case, the cover plate DP preferably covers the entire chip surface.

For removing the semiconductor chip C, the cover plate DP of the holding arm A1' is lifted up and laterally turned away.

Figure 6:
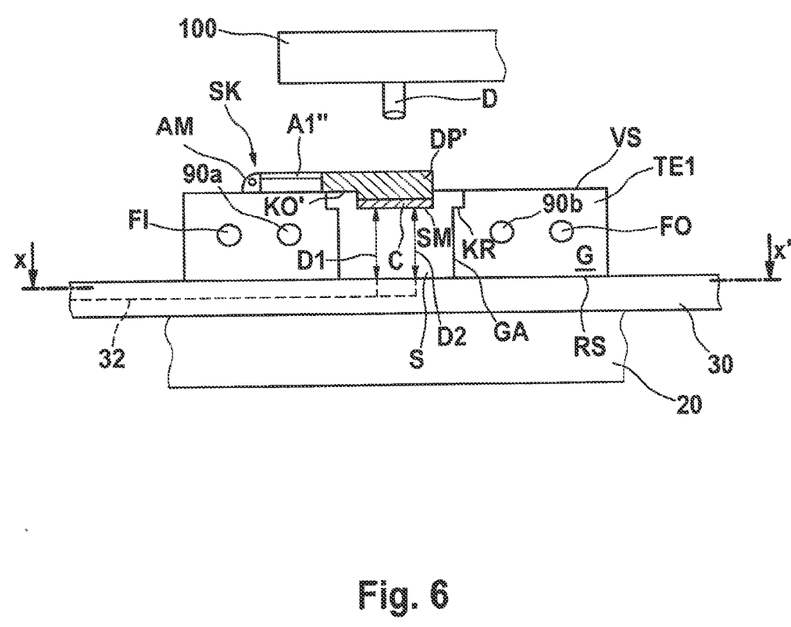
FIG. 6 is a schematic cross-section of the first temperature control means according to yet a further embodiment of the conditioning device according to the invention.

FIG. 6 is a schematic cross-section of the first temperature control means according to yet a further embodiment of the conditioning device according to the invention.

FIG. 6 is analogous to FIG. 2A, in this embodiment a cover plate DP' made of high-grade steel likewise being provided, which is in thermal contact with the semiconductor chip C and the chip bonding pedestal S and the base body the contact region for the temperature control device TE1 being denoted by the reference numeral KO'. The cover plate DP' is connected via the holding arm A1'' to an articulated means AM, which can be pneumatically, electrically or mechanically controlled via a control signal SK.

When operating the depicted embodiments of the conditioning device according to the invention according to FIGS. 1 to 6, a plurality of semiconductor chips C are automatically inserted into the chip receiving regions SM of the temperature control means TE1, TE2, TE3 by means of the handling device 100, the cover 1a of the container 5 being open.

The cover 1a of the container 5 is subsequently closed, and the chip temperature control means TE1, TE2, TE3 is brought to a predetermined measuring temperature, for example −40° C. When the measuring temperature is reached, electrical signals of the test device 500 are fed from and/or to the semiconductor chip C inserted in the chip receiving region SM according to a desired test procedure.

After the measurements are completed, the cover 1a is opened, it being ensured by means of the dried air being discharged from the discharge members 40 that there is excess pressure, in such a way that the temperature control means TE1, TE2, TE3 can be kept at a lower temperature without ice forming.

After the plurality of semiconductor chips C are automatically removed from the chip receiving regions SM of the chip bonding pedestals S, loading etc. can take place again.

Although the present invention has been described above with reference to preferred embodiments, it is not limited thereto, but can be modified in various ways.

Although a holding means for the semiconductor chips is provided in the above-described embodiments in order to hold said chips in the chip receiving regions in particular during measurements having different angular positions, it is not absolutely necessary, in particular if a measurement is provided when horizontal. The holding means can also not only be provided in the form of a pneumatic holding means, but also can be electrically or electromechanically implemented.

The geometry shown of the base body and of the chip bonding pedestal is likewise only exemplary and can vary in a number of ways. The number of modules of the temperature control means can also be selected in an application-specific manner.

The invention claimed is:

1. A device for conditioning semiconductor chips, comprising:
    a chip temperature control unit for receiving a semiconductor chip or a plurality of semiconductor chips, which comprises a base body which can be flushed with a fluid for temperature control and comprises a corresponding number of recesses which extend from a front face to a rear face of the base body;
    a corresponding number of chip bonding pedestals, which are inserted into the recesses in thermal contact with the base body and which comprise a chip receiving region on the front face and a wiring unit on the inside, which is constructed for supplying electrical signals from and/or to the semiconductor chip inserted in the chip receiving region; and
    a motherboard, which is attached to rear face of the base body in such a way that the wiring means of the chip bonding pedestal is electrically connected to a wiring unit of the motherboard; and
    a carrier table, to which the base body and the motherboard attached thereto are fastened, and which defines a plane, and which can be rotated about at least one axis which is parallel to the plane of the carrier table, such that test measurements are possible at various angular positions of the semiconductor chips,
    respective chip holding unit being provided on the front face of the base body laterally adjacent to the chip bonding pedestals and being able to be actuated to hold a respective semiconductor chip in the associated chip receiving region,
    the chip holding unit comprising holding arms which are mechanically, pneumatically or electrically actuated and which are vertically liftable and laterally rotatable by mechanically, pneumatically or electrically actuation relative to the base body for removal and placement of the semiconductor chips,
    wherein a handling device is provided for simultaneous loading and unloading of the semiconductor chips.

2. The device of claim 1, wherein the chip temperature control unit is provided in a substantially closed container which comprises a cover above the chip receiving regions, in which the cover is openable for loading and unloading the semiconductor chips.

3. The device of claim 2, wherein the respective chip holding unit is provided on the front face of the base body adjacent to the chip bonding pedestals and can be actuated to hold a respective semiconductor chip in the associated chip receiving region.

4. The device of claim 3, wherein the chip holding unit comprises holding arms which can be actuated by at least one of mechanically, pneumatically, and electrically.

5. The device of claim 1, wherein the base body and the motherboard attached thereto are fastened to a carrier table.

* * * * *